United States Patent [19]

Harada

[11] Patent Number: 4,989,181
[45] Date of Patent: Jan. 29, 1991

[54] SERIAL MEMORY DEVICE PROVIDED WITH HIGH-SPEED ADDRESS CONTROL CIRCUIT

[75] Inventor: Moemi Harada, Tokyo, Japan

[73] Assignee: NEC Corporation, Tokyo, Japan

[21] Appl. No.: 358,112

[22] Filed: May 30, 1989

[30] Foreign Application Priority Data

May 30, 1988 [JP] Japan ................................ 63-133453

[51] Int. Cl.⁵ ............................................... G11C 8/00
[52] U.S. Cl. .................................... 365/200; 365/240; 371/10.2
[58] Field of Search .................... 365/200, 230.05, 239, 365/240, 221; 371/10.2

[56] References Cited

U.S. PATENT DOCUMENTS 4,701,887 10/1987 Ogawa ................................ 365/200

Primary Examiner—Joseph A. Popek
Attorney, Agent, or Firm—Sughrue, Mion, Zinn, Macpeak & Seas

[57] ABSTRACT

A semiconductor memory device having a serial access port and an improved redundant structure which can operate at a high speed is disclosed. The memory device comprises a normal memory cell array, a redundant memory cell array, a serial selection circuit for serially selecting data stored in the normal cell array in response to a control signal, a defective location memory for storing address of a defective memory cell or cells in the normal memory cell array, a counter incremented by the control signal for indicating the address selected by the serial selection circuit, a control circuit for selecting the redundant memory cell array when the content of the counter coincides with the content of the defective location memory, a plus-one circuit for generating an initial address which is larger than external initial address by one, and a count-up control circuit for applyig the control signal to the counter from its second occurrence after the application of the external initial address.

5 Claims, 6 Drawing Sheets

SERIAL MEMORY DEVICE PROVIDED WITH HIGH-SPEED ADDRESS CONTROL CIRCUIT

BACKGROUND OF THE INVENTION

1. Field of the Invention:

The present invention relates to a semiconductor memory device, and more particularly to a memory device having a serial access port.

2. Description of the Related Art:

A serial access memory having a serial access port has been used as a video memory for storing image or video data. A dual-port memory is a representative example of the serial memory, which further has a random access port in addition to the serial access port. An example of the dual port memory is disclosed in U.S. Pat. specification No. 4,633,441 issued to Ishimoto. The conventional memory having the serial access port is constructed as follows. A plurality of memory cells are arranged in a matrix form of rows and columns and one row of memory cells are read out at a time in parallel. The serial access port has a data register for storing data read from the selected row of memory cells and a serial read circuit for serially reading data stored in the data register from an initial location one by one in synchronism with a shift pulse. The selection circuit includes a shift register whose output is used to select data to be read-out from the data register and a column decoder for controlling the shift register to determine the initial location in accordance with external column address information.

As the patterns have become finer and finer in semiconductor memories in recent years, defects of memory cells, word lines or bit lines tend to increase, and the necessity of using a redundancy circuit for replacing the defective memory cell, word line or bit line has arisen.

The conventional redundancy circuit of serial port includes a counter circuit receiving a first control signal for indicating an accessed address designated by the shift register, an address memory circuit for storing the defective address of a defective memory cell, bit line or the defective address of a serial register and a coincidence circuit for detecting coincidence between the output of the counter and the defective address and for outputting a second control signal for replacing the defective memory cell, bit line or serial register by the memory cell, bit line or serial register of the redundancy circuit.

In the serial memory having the redundancy circuit described above, setting of the initial address to the shift register and setting the counter at the time of data transfer are conducted simultaneously in accordance with the external address. Accordingly, the counter must be set at the initial state corresponding to the external address before the subsequent input of the first control signal and the count-up operation of the counter is performed by the subsequent input of the first control signal after the data transfer of read-out, data to the data register. When the time necessary for the shift operation of the shift register and the time necessary for the count-up operation of the counter are compared, the latter is generally longer. Therefore, there occurs the problem in that the period of the first control signal is elongated to make the operation of the counter synchronized with the operation of the shift register in the memory having the redundancy circuit. Therefore, the effective serial access speed performed by the shift register is lowered.

SUMMARY OF THE INVENTION

It is an object of the present invention to provide a semiconductor memory having a serial port and a redundant structure which can operate at a high speed.

It is another object of the present invention to provide a serial memory provided with an improved redundant circuit which can operate at a high speed.

The semiconductor memory device according to the present invention comprises a plurality of normal memory cells, at least one redundant memory cell, a serial selection circuit for serially selecting the normal memory cells in synchronism with a first control signal, an address memory for storing a location of a defective memory cells in the normal memory cells, a counter for indicating the address of the selected memory cell by the serial selection circuit, the counter being incremented in response to the first control signal, a comparison circuit for comparing the state of the counter with the content of the address memory, the comparison circuit generating a second control signal when the content of the counter being coincident with the content of the address memory, a redundant selection circuit responsive to the second control signal for selecting the redundant memory cell in place of the normal memory cell, means for receiving an initial address, an address modification circuit for generating an internal address which is larger than the initial address by one, means for determining the state of the serial selection circuit in accordance with the initial address, and a count-up circuit for incrementing the state of the counter in response to the first control signal after a second occurrence of the first control signal after the internal address is generated.

According to the present invention, the counter is directly set at the position which is larger than the externally supplied initial address during a data transfer period by one and the count-up operation of the counter in accordance with the first occurrence of the first control signal is omitted in the data transfer period. Therefore, the counter can follow the selection performed by the serial selection circuit at a high speed from the second access location subsequent to the memory location designated by the initial address.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1:
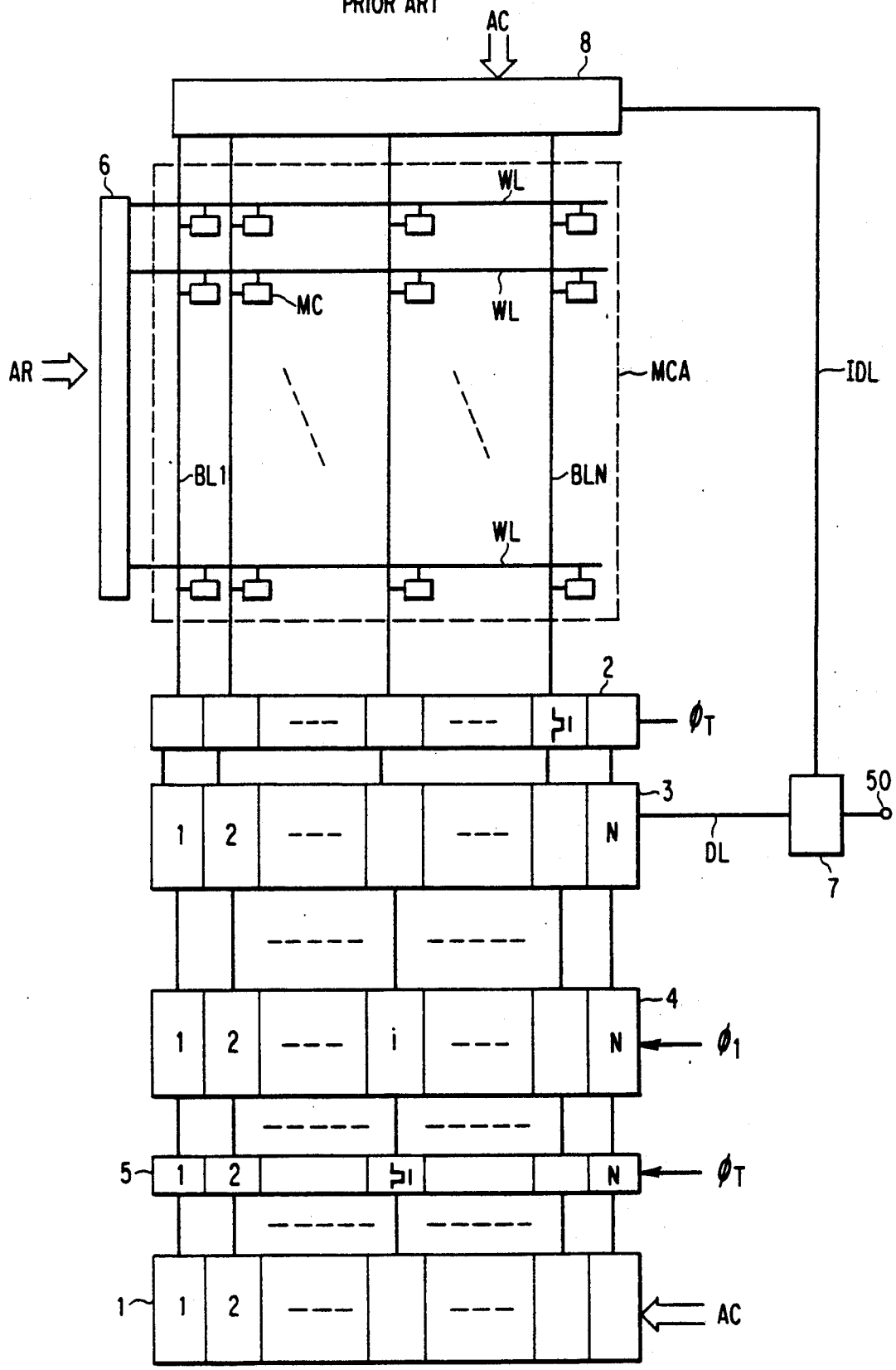
FIG. 1 is a schematic block diagram showing a memory having a serial access port in the prior art.

Prior Art:

With reference to FIG. 1, a general structure of the conventional memory having the serial access port will be explained.

The memory comprises a memory cell array MCA having a plurality of memory cells MC arranged in a matrix form of rows and columns, a plurality of word lines WL and a plurality of bit lines BL1–BLN, a row decoder for selecting one of the word lines in accordance with row address information, and the serial access port. The serial access port includes a data transfer circuit 2, a data register 3 having N bit locations (1-N) for storing data transferred thereto from the bit lines BL1–BLN via the data transfer circuit 2 during a data transfer period in response to a transfer signal $\phi_T$, a shift register 4 having N shift stages whose outputs are used to selectively transfer data stored in the data register 3 to a data line DL connected to an output circuit 7 and further to a serial output terminal SU, a column decoder 1 receiving column address information to make one of N outputs selective, and an address pre-set circuit 5 for determining the state of the shift register in response to the transfer signal $\phi_T$.

When the data are serially outputted in this memory, data transfer is made in the columns for the data from the memory cells coupled to the word line selected by the decoder 6 to the data register 3 through the bit lines and the transfer circuit 2. The data thus stored in the data register 3 are outputted serially and sequentially by the output of the shift register 4 as a serial pointer. Accordingly, the start address of the data which is first outputted after the transfer period is given by the external address AC. When the external column address AC is given, its address is set to the serial pointer 4 from the column decoder 1 through the address pre-set circuit 5 and thereafter that address is incremented one address by one whenever a first control signal $\phi_1$ is inputted.

In this memory, the transferred data are once stored in the data register 3 and the data are outputted one bit by one by the pointer output of the serial pointer 4 to the output circuit 7.

At this time, if the data are to be transferred to the serial data register 3 from the data transfer timing to the data output and then data read operation of the start bit is to be made, the period of the first control signal $\phi_1$ of the start (first) bit after the data transfer must be longer than the period of the first control signal $\phi_1$ required for the second bit and so forth. Therefore, the serial cycle is limited by the output of the start bit. Accordingly, this memory employs the arrangement wherein a random column decoder 8 lets the serial output circuit 7 latch the start bit of the column data by selecting it by the random column decoder 8 via a data output line IDL simultaneously with the transfer of the data to the serial data register 3. According to this arrangement, the data output from the data register 3 may be made from the first control signal $\phi_1$ of the second cycle and so forth after the data transfer, and the transfer data set to the serial register 3 and the data read operation of the second bit of the serial output may be made till and in the second cycle. In this manner the serial cycle can be speed up.

As the patterns have become finer and finer in semiconductor memories in recent years, defects of memory cells, word lines or bit lines tend to increase, and the necessity of using a redundancy circuit for replacing the defective memory cell, word line or bit line has arisen.

The conventional redundancy circuit of serial system port consists of a counter circuit for inputting the first control signal $\phi_1$ for increasing or decreasing a read/write address, an address memory circuit for storing the defective memory cell, bit line or the defective address of a serial register and a coincidence circuit for detecting coincidence between the output of the counter and the defective address and for outputting a second control signal $\phi_2$ for replacing the defective memory cell, bit line or serial register by the memory cell, bit line or serial register of redundancy.

A prior art example which is most analogous to the present invention will be explained with reference to FIG. 2.

Figure 2:
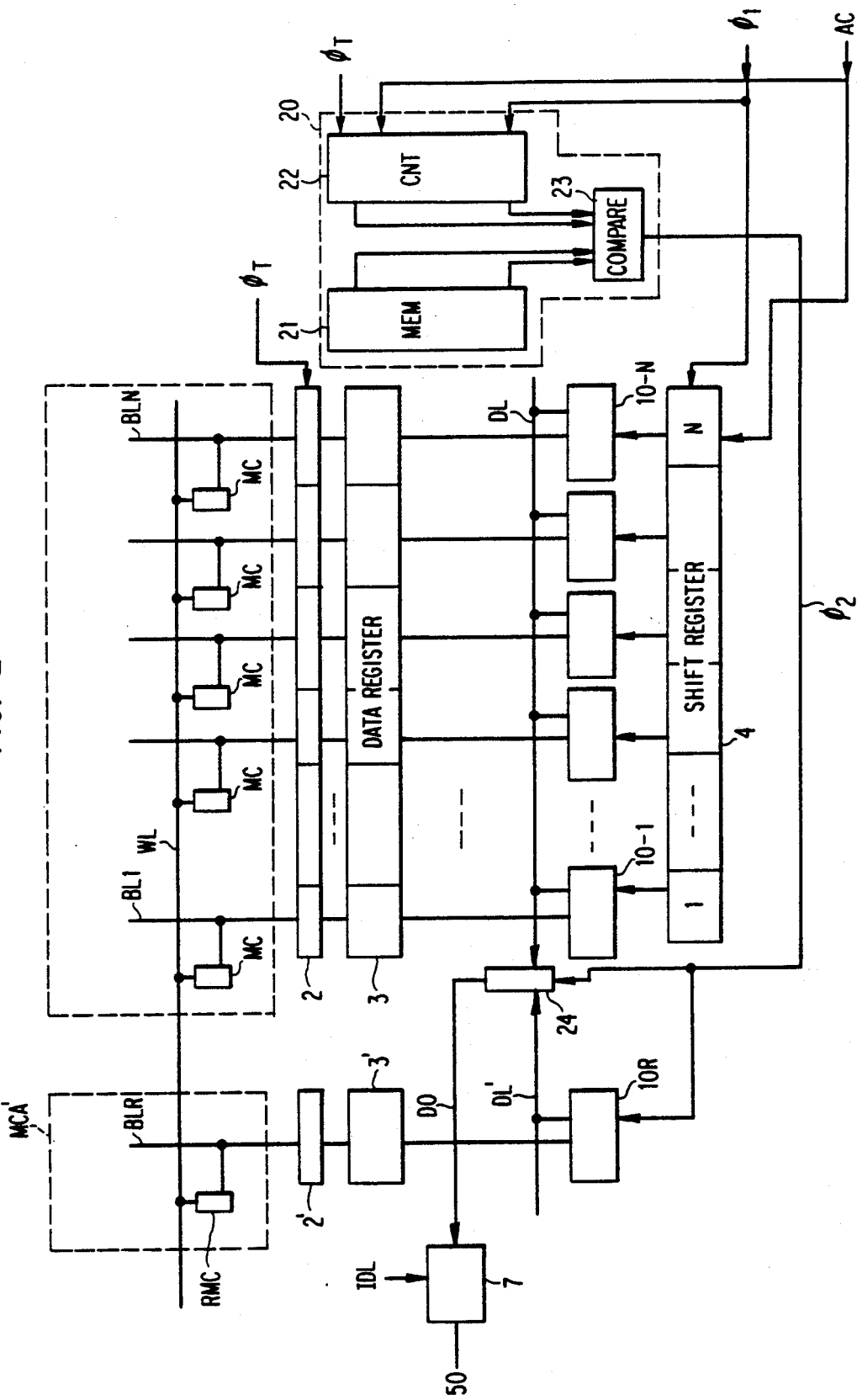
FIG. 2 is a schematic block diagram of the serial access port of the memory of FIG. 1.
Figure 3:
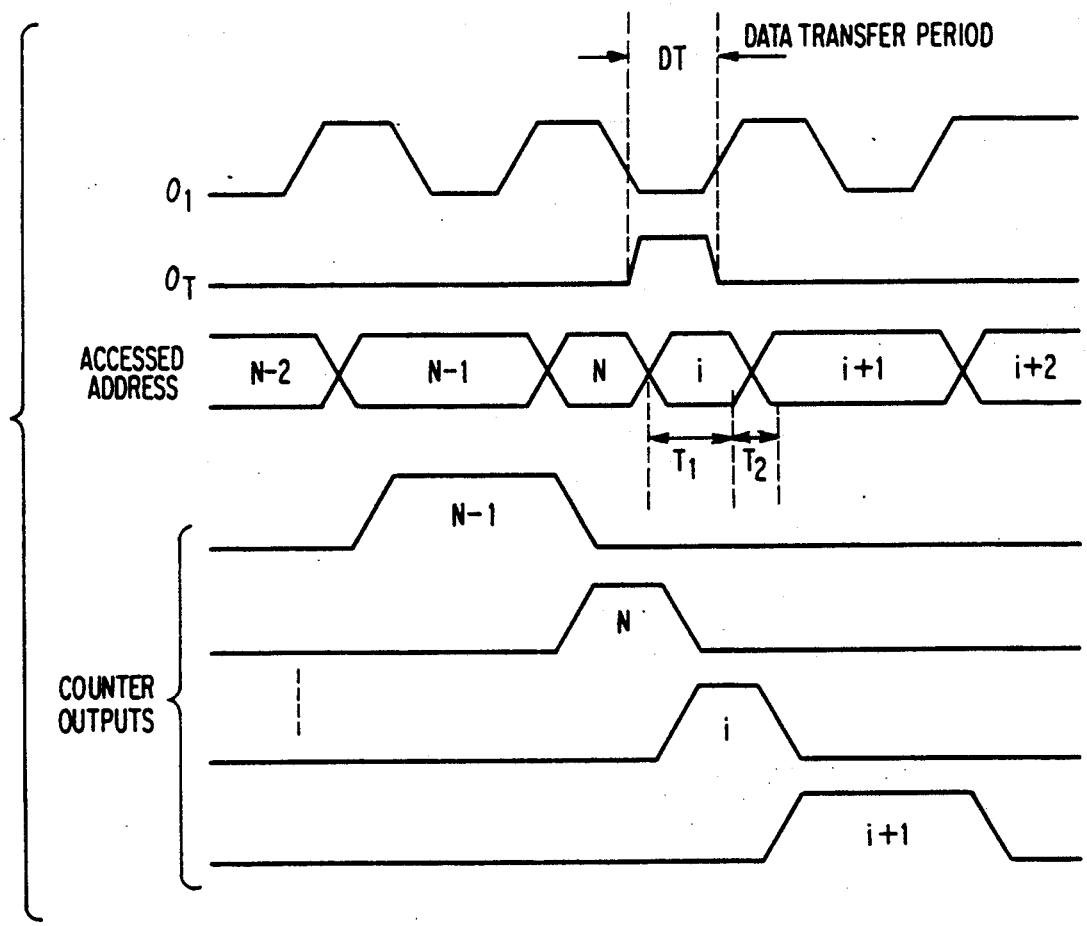
FIG. 3 is a timing diagram showing a operation of the memory of FIG. 2.

FIG. 2 is a block diagram of this prior art example and FIG. 3 shows its operations.

As shown in FIG. 2, the serial memory having a redundant structure comprises a redundant memory array MCA' having a plurality of redundant memory cells RMC (only one being representatively illustrated), a redundant transfer circuit 2', a redundant data register 3' and a redundant selection gate 10R for selectively establishing a signal path between the output of the data register 3' and a redundant data line DL'. Column selection gates 10-1 to 10-N are controlled by the outputs of the shift register 4 and one of the gates 10-1 to 10-N is enabled to perform a signal path between one of the outputs of the data register 3 and the data line DL. A redundant control circuit 20 includes a defective address memory circuit 21 for storing defective memory location to be replaced by the redundant memory cell, a counter 22 indicating the address which is actually designated address by the shift register 4 and incremented by the first control signal $\phi_1$ and a coincidence detection circuit for detecting that the content of the counter 22 coincides with the defective memory location of the memory circuit 21 to generate a second control signal $\phi_2$. A switch circuit 24 connects the data line DL to an output data line DO when the $\phi_2$ is not present and the redundant data line DL' to DO when the signal $\phi_2$ is present. The address of an external address AC is pre-set as the initial address of serial access to the shift register 4 and the same address is also pre-set to the counter 22 during the data transfer period in response to $\phi_T$. Only one of the shift register outputs is under the state for turning on gates 10-1 to 10-N and they shift by one in a greater direction each time when the first control signal $\phi_1$ is enabled.

On the other hand, the counter output is increased by one by enabling or clocking of the first control signal $\phi_1$. In other words, the address of the switches 10-1 to 10-N which is turned on by the shift register 4 is always in conformity with the output address of the counter 22. These gates 10-1 to 10-N connect the output of the serial data register 3 to the line DL by the shift register output. The counter output is compared with the output of the defective address memory circuit 21 storing in advance the address of the defective cell location, e.g. defetive bit line by the coincidence detection circuit 23 and when they are coincident with each other, the coincidence detection circuit 23 outputs the second control signal $\phi_2$ for replacing the defective bit line by the bit line BLR.

When the bit line free from defect is selected, the second control signal $\phi_2$ is turned off (the state where the counter output and the output of the defective address memory circuit are not coincident) and the gate 10R is turned off so that the switch 24 connects the line DL to the output circuit 7.

When the defective bit line is selected, the second control signal $\phi_2$ is on (the state where the counter output and the output of the defective address memory circuit are coincident) and the gate 10R is turned on and connects the redundancy bit line BLR to the line DL'. In this manner the defective bit line can be replaced by the redundancy bit line.

In the redundancy circuit of the serial system port in the conventional memory described above, the external address given at the pre-set of the initial address to the shift register 4 must be simultaneously written into the counter 22 at the short time of data transfer. Accordingly, the counter must make pre-set of the external address and the count-up operation before the following receipt of the first control signal $\phi_1$, as shown in FIG. 3. Namely, when the signal $\phi_T$ is made active during the data transfer period $D_T$, the external address i is taken into the shift register and the counter 22 during a period $T_1$ and subsequently in response to the following input of $\phi_1$, the state of the shift register 4 and the counter 22 are incremented during an increment period $T_2$.

When the time necessary for the shift operation of the shift register 4 and the time necessary for the count-up operation of the counter 22 are compared, the latter is generally longer. Therefore, there occurs the problem in that the period of the first control signal $\phi_1$ is elongated by using the redundancy circuit. Thus, the operation speed of the memory is limited by the operation speed of the counter 22.

Figure 4:
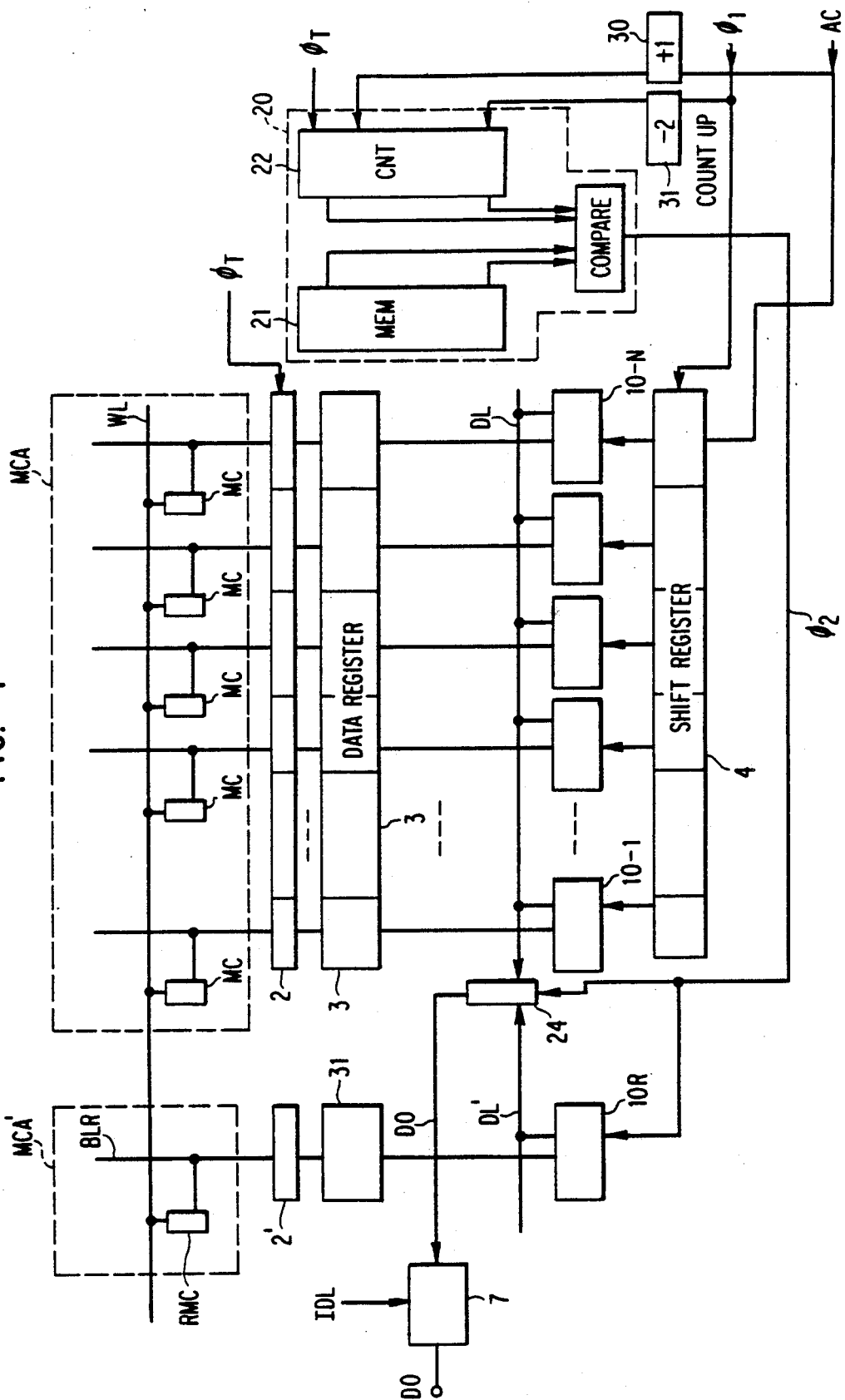
FIG. 4 is a schematic block diagram showing a serial access memory according to one embodiment of the present invention.

Embodiment:

With reference to FIG. 4, the memory according to one embodiment of the present invention will be explained. In FIG. 4, the elements or portions corresponding to those in the previous drawings are denoted by the same references and descriptions to those elements will not be repeated in the following explanations.

The memory of this embodiment is obtained by a plus-one circuit 30 and a count-up control circuit 31. The plus-one circuit 30 receives the external column address AC and produces the sum of the address AC and 1. The sum, i.e. the plus-one address is used as the initial address of the counter 22. The count-up control circuit 31 inhibits the first input of the first control signal $\phi_1$ after the external address AC is given, to the counter 22. Thereafter, the output address of the counter 22 is sequentially incremented by the first control signal $\phi_1$ in the same way as in the prior art.

In the construction described above, the data of the memory cells connected to the selected word line are transferred to and latched by the register 3 through the data transfer switch 2 at the time of data transfer. As explained with reference to the data transfer mechanism shown in FIGS. 1 and 2, the data read out by the first control signal $\phi_1$ of the first time is selected by the output of the random system column selection circuit 8 and is held by the serial output circuit 7 through the output line IDL. When the address which is the first bit after the data transfer is replaced by the redundancy circuit, the redundancy circuit of the random system port 8 is used and the data of the redundancy circuit is held in the serial output circuit 7 through the line IDL. This data is outputted by the first control signal $\phi_1$ at the first time after the data transfer. In other words, since the data output of the first bit after the data transfer is not made from the serial data register, it is not necessary to judge the use of the redundancy circuit of the first bit in the serial port. Therefore, the internal address which is the sum of the external address at the time of the data transfer plus 1 is set to the counter 22 by the plus 1 circuit 30 and count-up of the first counter output address from the first control signal $\phi_1$ from the second occurrence is made. The first control signal $\phi_1$ at the first occurrence after the data transfer inhibits the input to the counter 22 by the count-up control circuit 31. Therefore, the output of the counter 22 outputs the address which is greater by 1 than the external address at the time of the data transfer to the address coincidence detection circuit 23 until count-up of the counter output address is made by the input of the first control signal $\phi_1$ of the second time after the data transfer.

Accordingly, the address of the counter 22 and the address of the shift register output the mutually different addresses until count-up of the address is made by the input of the first control signal $\phi_1$ of the second occurrence after the data transfer, but the same address is designated after the first control signal $\phi_1$ of the second time and so forth.

When the operation described above is conducted, the increment operation by the first control signal $\phi_1$ of the first time of the counter output address shown in FIG. 3 can be omitted so that the clock period of the serial system port using the redundancy circuit can be further shortened.

Figure 5:
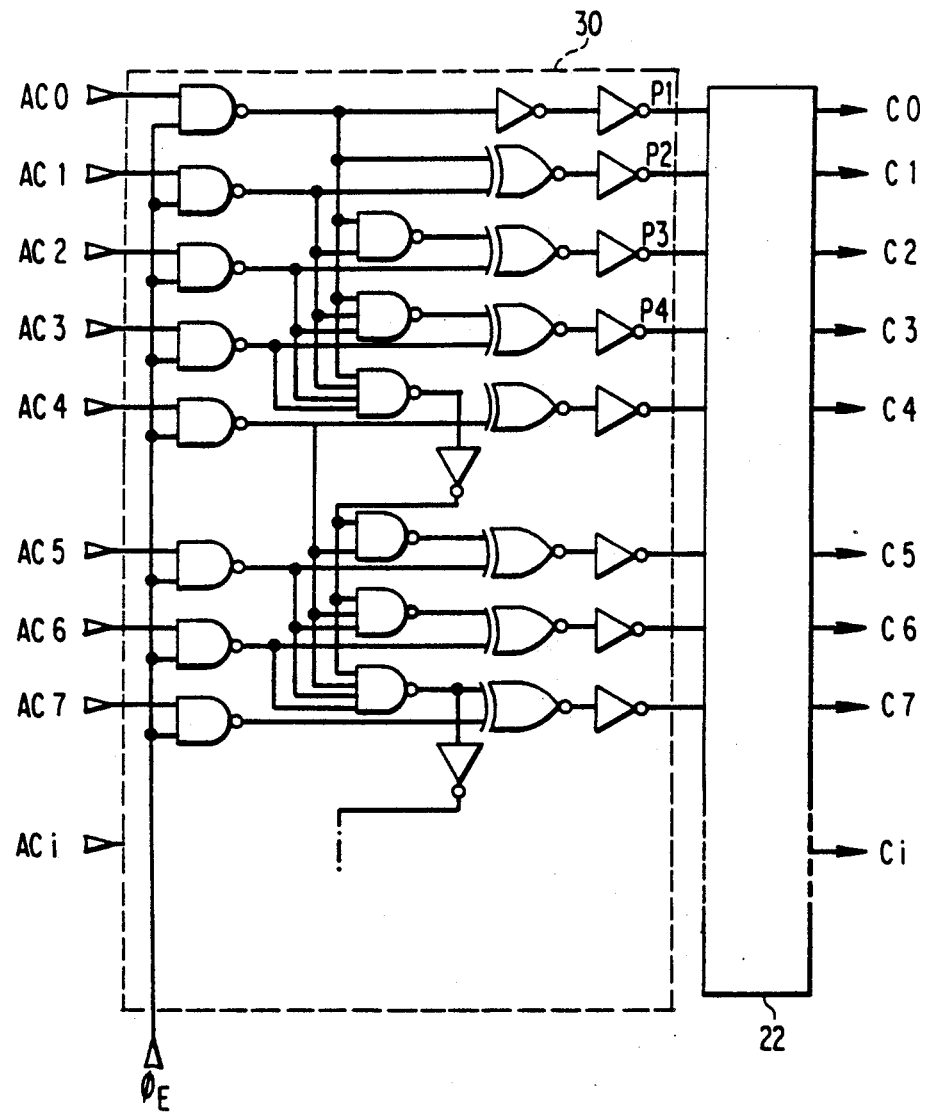
FIG. 5 is a schematic block diagram of a plus-one circuit employed in the memory of FIG. 1.
Figure 6:
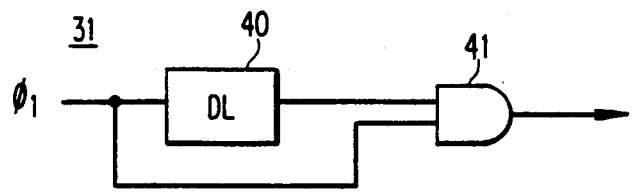
FIG. 6 is a schematic block diagram of a count control circuit employed in the memory of FIG. 1.

An example of the plus-one circuit 30 is shown in FIG. 5. In FIG. 5, address signals AC0–ACi serve as the address AC and the plus-one circuit 30 includes a plurality of NAND gates, exclusive-OR gates and inverters. The outputs of the circuit 30 are applied to the counter 22.

An example of the count-up control circuit 31 includes a one-bit delay circuit 41 for delaying the first control signal $\phi_1$ by its one bit length and an AND gate 41 receiving the output of the delay circuit 40 and the control signal $\phi_1$. Accordingly, the AND gate 41 transmits the control signal from its second occurrence.

Figure 7:
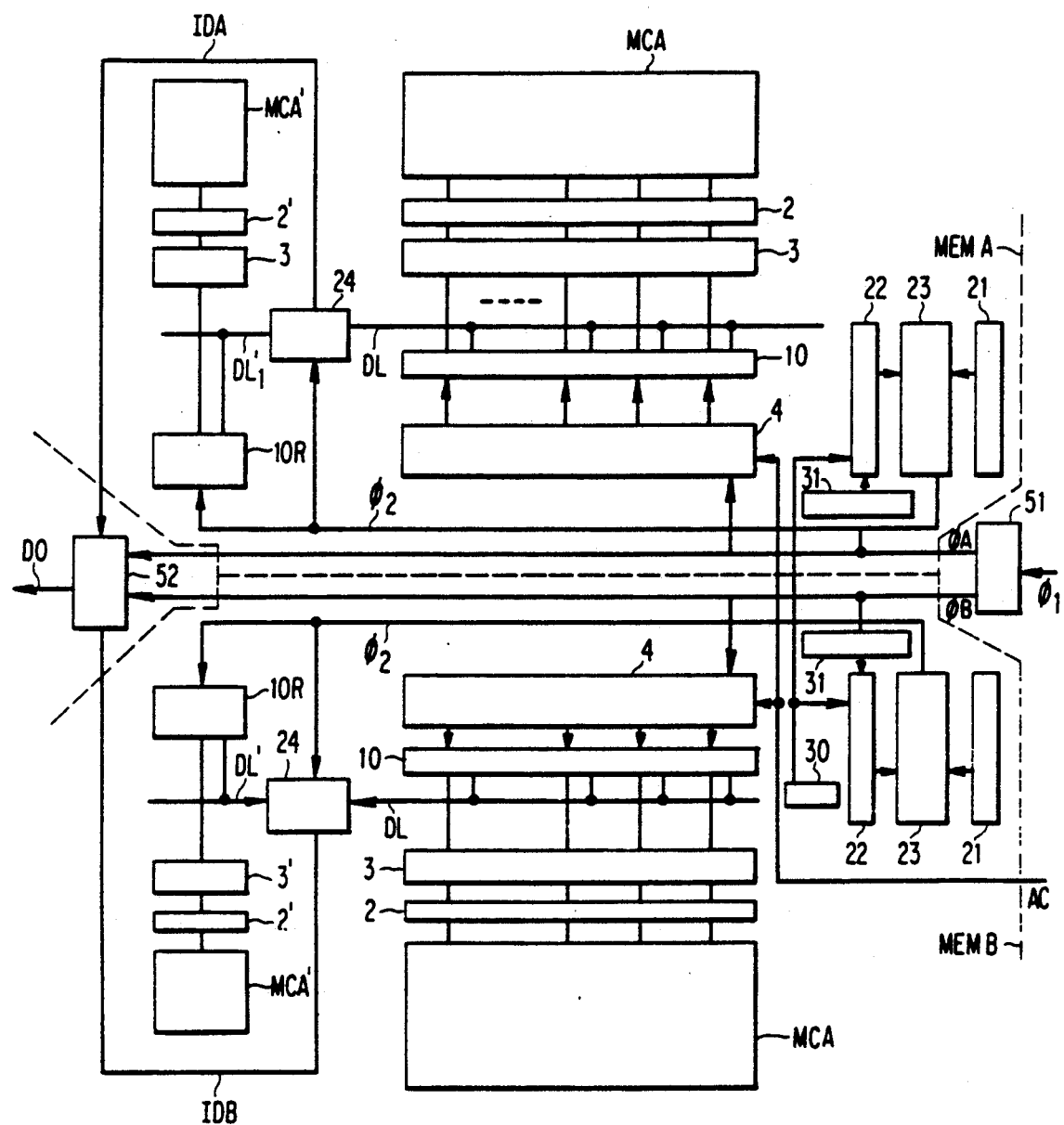
FIG. 7 is a schematic block diagram of a serial memory according to another embodiment of the present invention.

With reference to FIG. 7, the memory according to another embodiment of the present invention will be explained.

The memory according to this embodiment comprises two memory blocks MEM A and MEM B which are substantially the same as that of FIG. 4 except the following points. Namely, the output of the plus-one circuit 30 of the memory block MEM B is applied to the counter 22 of the memory block MEM B and also to the counter 22 of the block MEM A. A frequency divider 51 receives an external signal $\phi_1'$ and generates the first control signal $\phi_A$ to be used in the memory block MEM A and the first control signal $\phi_B$ having the opposite phase to $\phi_A$ and to be used in MEM B. An output selection circuit 52 receives the outputs of the selection circuits 24 of the blocks MEM A and MEM B via lines IDA and IDB, respectively to selectively transmits data at one of IDA and IDB to the line D0 in response to $\phi_A$ and $\phi_B$.

In this memory, up to two sets of defective bits can be replaced by preparing two sets of counter defective address memory circuits and coincidence detection circuits, respectively. Since the first control signal $\phi_1$ is frequency-divided to the control signals $\phi_A$ and $\phi_B$, the operation can be made for the first control signal $\phi_1$ having a shorter period.

As described above, since the internal address to be pre-set to the counter circuit at the time of data transfer is the address which is greater by one address than the external address in the present invention, the count-up operation of the counter after pre-set can be omitted by one and the period of the first control signal can be further shortened at the time of use of the redundancy circuit.

I claim:

1. A semiconductor memory device comprising a plurality of normal memory cells, at least one redundant memory cell, a serial selection circuit for serially selecting said normal memory cells in synchronism with a first control signal, a defective address memory circuit for storing locations of defective memory cells in said normal memory cells, a counter whose output corresponds to the address of the memory cell selected by said serial selection circuit, said counter being incremented in response to said first control signal, a comparison circuit for comparing the output of said counter with the output of said defective address memory circuit, said comparison circuit generating a second control signal when the output of said counter being coincident with the output of said defective address memory circuit, a redundant selection circuit responsive to said second control signal for selecting said redundant memory cell in place of said normal memory cell, means for receiving an initial address corresponding to supplied external address, an address modification circuit receiving said initial address for generating an internal address which is larger than said initial addres by one, said counter being preset with said internal address, means for determining the state of said serial selection circuit relative to said initial address, and a count-up circuit for incrementing the state of said counter in response to said first control signal after a second occurrence of said first control signal after said internal address is generated.

2. The memory device according to claim 1, in which said serial selection circuit includes a data register having a plurality of storage locations, a data transfer circuit coupled between said normal memory cells and said data register, a data line, a column selection circuit connected between said data register and said data line, and a shift register having a plurality of outputs which are used to control said column selection circuit, said shift register being preset with said initial address.

3. The memory device according to claim 1, in which said count-up circuit includes a delay circuit responsive to said first control signal for generating a delay signal and an AND gate receiving said delay signal and said first control signal.

4. A semiconductor memory device comprising a normal array of memory cells, a redundant array of memory cells, means for receiving an initial address corresponding to a supplied external address, a serial selection circuit for serially outputting memory cells starting with a memory cell located at said initial address and continuing therefrom by incrementing said initial address one by one in synchronism with a first control signal, and a redundant control circuit for selecting the memory cell of said redundant array of memory cells when the memory cell of said normal array of memory cells to be selected by said serial selection circuit is defective, said redundant control circuit including a plus circuit for generating an internal address greater by a predetermined address than initial address, a counter circuit for sequentially incrementing said internal address in accordance with said first control signal wherein said counter circuit is preset with said internal address generated by said plus circuit, a count-up control circuit for inhibiting the operation of said counter circuit for the first occurrence of said first control signal after said counter circuit is preset with said internal address, a detective address memory circuit for storing locations of defective memory cells in said normal array of a memory cells, and a coincidence detection circuit for outputting a second control signal for controlling redundancy substitution by detecting whether or not the output signal of said counter circuit is coincident with the defective address stored in said address memory circuit.

5. The memory device according to claim 4, further comprising a random selection circuit for selecting one of the memory cells in accordance with said initial address and output means for outputting data stored in the memory cell selected by said random selection circuit and thereafter outputting data selected by said serial selection circuit.

* * * * *

UNITED STATES PATENT AND TRADEMARK OFFICE
CERTIFICATE OF CORRECTION

PATENT NO. : 4,989,181

DATED : January 29, 1991

INVENTOR(S) : Moemi Harada

It is certified that error appears in the above-identified patent and that said Letters Patent is hereby corrected as shown below:

Col. 4, line 61    delete "defetive" and insert -- defective --;

Col. 7, line 30    delete "addres" and insert -- address --.

Signed and Sealed this

Twenty-eighth Day of July, 1992

*Attest:*

DOUGLAS B. COMER

*Attesting Officer*     *Acting Commissioner of Patents and Trademarks*